(12) United States Patent
Zhao et al.

(10) Patent No.: US 7,838,066 B2
(45) Date of Patent: Nov. 23, 2010

(54) FERROELECTRIC MEDIA WITH ROBUST SERVO MARKS AND STORAGE AREAS WITH LOW LEAKAGE CURRENT

(75) Inventors: Tong Zhao, Cranberry Township, PA (US); Andreas Roelofs, Eden Prairie, MN (US); Cedric Stephane Bedoya, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 586 days.

(21) Appl. No.: 11/961,705

(22) Filed: Dec. 20, 2007

(65) Prior Publication Data
US 2009/0160097 A1 Jun. 25, 2009

(51) Int. Cl.
*B05D 3/04* (2006.01)
(52) U.S. Cl. .............. 427/126.3; 427/282; 427/377
(58) Field of Classification Search .............. 427/58, 427/100, 282, 383.1; 428/826–837, 836.2, 428/836.3; 369/126
See application file for complete search history.

(56) References Cited

U.S. PATENT DOCUMENTS

| 5,170,460 | A | * | 12/1992 | Arvidsson et al. ........... 385/129 |
| 5,415,743 | A | * | 5/1995 | Harada .................... 427/466 |
| 5,836,073 | A | * | 11/1998 | Mizuuchi et al. ............ 29/600 |
| 5,953,245 | A | * | 9/1999 | Nishimura ................. 365/145 |
| 6,363,189 | B1 | * | 3/2002 | Minakata et al. ............ 385/41 |
| RE38,565 | E | * | 8/2004 | Hayashi et al. .............. 438/3 |
| 7,115,513 | B2 | * | 10/2006 | Chiang et al. .............. 438/689 |
| 2005/0094430 | A1 | | 5/2005 | Nauka et al. |
| 2005/0128616 | A1 | | 6/2005 | Johns et al. |
| 2005/0285169 | A1 | | 12/2005 | Ahner et al. |
| 2006/0023606 | A1 | | 2/2006 | Lutwyche et al. |
| 2007/0011899 | A1 | | 1/2007 | Gage et al. |
| 2007/0041233 | A1 | | 2/2007 | Roelofs et al. |
| 2007/0070596 | A1 | | 3/2007 | Sievers et al. |

* cited by examiner

*Primary Examiner*—Timothy H Meeks
*Assistant Examiner*—John Bohland, Jr.
(74) *Attorney, Agent, or Firm*—Kinney & Lange, P.A.

(57) ABSTRACT

A single annealing process simultaneously creates local areas of ferroelectric imprint that can be used as markers, and areas with low leakage current that exhibit ideal symmetric switching on ferroelectric recording media.

19 Claims, 6 Drawing Sheets

FERROELECTRIC MEDIA WITH ROBUST SERVO MARKS AND STORAGE AREAS WITH LOW LEAKAGE CURRENT

BACKGROUND

The present invention relates generally to ferroelectric data storage media scanned by probes, and to preparation of storage areas with low leakage current and servo marks for use in probe position servo control.

In devices that need to store information such as, for example, data storage devices, user data is typically stored on tracks of a storage media. In addition to the user data, position data is also provided on the storage media. The position data can include servo marks that, when read, generally indicate position coordinates (e.g. X, Y coordinates, track number, or sector number) of a transducer relative to the storage media surface. Such devices also include a servo system that positions the transducer over a selected track based on feedback of the position data. The servo system may have a "seek mode" that moves the transducer from one track to another track based on reading the servo marks. The servo system also may have a "tracking mode" in which the transducer is precisely aligned with a selected track based on a reading of the servo marks.

At the time of manufacture of a magnetic data storage device, the servo marks are provided on the storage media. During operational use of the magnetic data storage device, the transducer reads the servo marks but there is typically no need to erase and rewrite servo data during operation. The position of servo marks on the media for a magnetic data storage device is therefore stable and does not change significantly during the operational life of the data storage device.

Data storage devices are being proposed to provide smaller size, higher capacity, and lower cost data storage devices. One particular example of such data storage device is a probe storage device. The probe storage device may include one or more transducers (e.g. one or more probes), that each includes a conductive element (e.g. an electrode), which is positioned adjacent to and in contact with a ferroelectric thin film storage media. User data is stored in the media by causing the polarization of the ferroelectric film to point "up" or "down" in a spatially small domain local to a tip of the transducer by applying suitable voltages to the transducer through the conductive element. Data can then be read by, for example, sensing current flow during polarization reversal.

For probe storage devices, position data can be placed on the ferroelectric storage media. However, the characteristics of probe storage do not permit stable positioning of the position data. When data is read from a ferroelectric storage media with a transducer, the conventional process of reading the data inherently erases or removes the data from the media. An electronic circuit that provides the read operation for a probe storage device must follow up and automatically provide a subsequent write operation of the same data in order to avoid loss of the data on the ferroelectric storage media. This is not an insurmountable problem for user data. However, with position data (e.g. servo marks) the repeated reading and automatic rewriting of position data will inevitably lead to loss of accurate position information. This instability and loss of accurate position information limits the useful life of the probe storage device. Adjacent tracks on the ferroelectric storage media containing user data will become misaligned due to creep of the position data and user data tracks will eventually overwrite or interfere with one another.

In addition, electrical leakage is a concern in ferroelectric probe storage media. Leakage current reduces the signal to noise ratio of recorded bits and degrades bit stability. A method is needed to provide ferroelectric probe storage media with stable position and user data that can be conveniently read with the same probe and electronics. Aspects of the present invention provide simultaneous solutions to these and other problems and offer other advantages over prior art.

SUMMARY

A method to simultaneously create patterns on ferroelectric thin film substrates containing regions that exhibit stable switching behavior and regions that do not switch is described. The method includes first masking selected areas with metal and then annealing the masked substrate for a short time at an elevated temperature in an oxidizing atmosphere. After the metal mask is removed, the regions under the mask exhibit ferroelectric imprint and do not switch. The regions exposed to the oxidizing atmosphere during the anneal exhibit ideal switching behavior and low leakage current.

DETAILED DESCRIPTION

Figure 1:
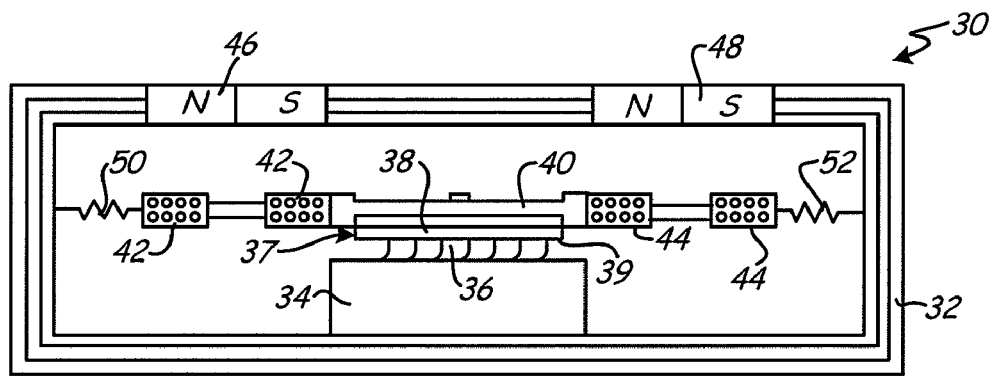
FIG. 1 is a schematic cross-sectional view of a device, according to one aspect of the present invention.

FIG. 1 is a schematic cross-sectional view of a device 30 constructed in accordance with the invention. The device 30 includes an enclosure 32 (which also may be referred to as a case, base, or frame) that contains a substrate 34. An array of transducers 36, which in accordance with one aspect of the invention may be an array of "probes," is positioned on the substrate 34. The transducers 36 extend upward to make contact with a ferroelectric storage media 37 which includes a ferroelectric storage layer 38 formed of, for example, lead zirconate titanate (PZT). The storage media 37 also includes a media surface 39. The storage media 37 is mounted on a movable member 40 (which also may be referred to as a sled). Coils 42 and 44 are mounted on the movable member 40. Magnets 46 and 48 are mounted in the enclosure 32 near the coils 42 and 44, respectively. Springs 50 and 52 form part of a suspension assembly that supports the movable member 40. It will be appreciated that the combination of coils 42 and 44 and magnets 46 and 48 forms an actuator assembly that is used to move the movable member 40. Electric current in the coils 42 and 44 creates a magnetic field that interacts with the magnetic field produced by the magnets 46 and 48 to produce a force that has a component in the plane of the movable member 40 and causes linear movement of the movable member 40. This movement in turn causes individual storage locations or domains on the media 37 to be moved relative to the transducers 36.

While FIG. 1 illustrates an example of one aspect of the invention, it will be appreciated that the invention is not limited to any particular configuration or associated components or to PZT only. For example, other ferroelectric materials can be employed. The transducers 36 can be arranged in various configurations relative to the media 37. In addition, other types of actuator assemblies, such as, for example, electrostatic actuators could provide the relative movement between the transducers 36 and the media 37.

Figure 2:
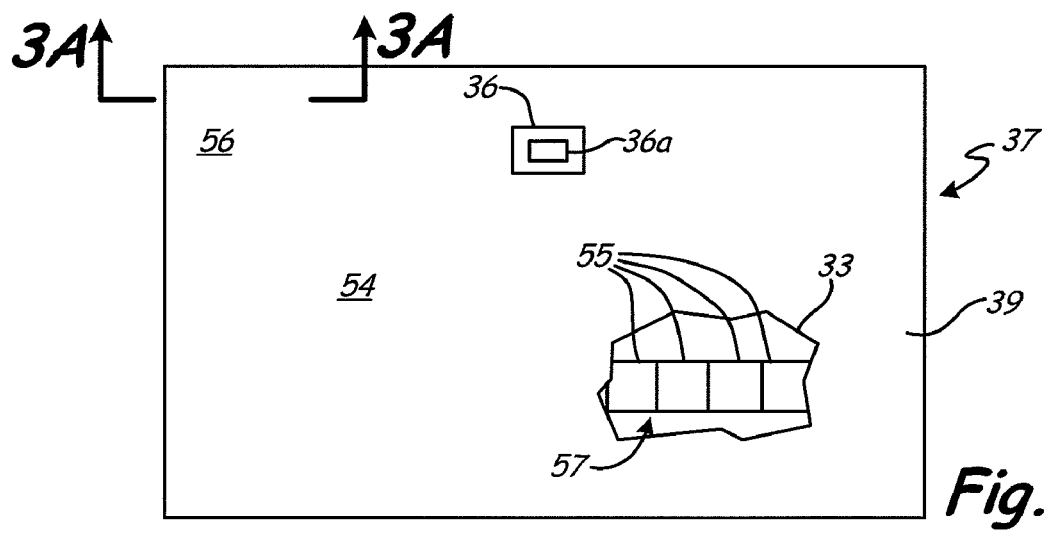
FIG. 2 is a top schematic view of a ferroelectric storage media, according to one aspect of the present invention.

FIG. 2 is a top schematic view of the ferroelectric storage media 37 in accordance with an aspect of the invention. The media surface 39 is accessible by a scanning motion of the transducers 36 and in particular by a tip 36a of the transducers 36, wherein only a single transducer 36 and corresponding tip 36a are schematically shown in FIG. 2 for illustration purposes. The storage media 37 includes a first media region 54 for storing user data. The first media region 54 includes a plurality of first domains 55 having a switchable (i.e. rewritable for an applied voltage signal) polarization state. The domains 55 are schematically shown in the cutaway portion 33 of the storage media 37 that illustrates an example track 57. It will be appreciated that the domains 55 may have a polarization pointing up or down.

Still referring to FIG. 2, the storage media 37 also includes a second media region 56 that includes a plurality of second domains. The plurality of second domains includes a switchable (i.e. rewritable for the applied voltage signal) polarization state domain and an unswitchable (i.e. not rewritable for the applied voltage signal) polarization state domain, as will be described herein with reference to FIG. 3A. Position data, which also may be referred to as servo data or servo information, is stored in the second media region 56. It will be appreciated that the storage media 37 may also include additional second media regions (not shown) for storing position data at various locations on the media surface 39.

A permanent non-switchable "0" state can be induced in ferroelectric thin films by annealing under reducing conditions such as in argon or under metal coverage in an oxygen atmosphere. Ferroelectric storage material for user data with low leakage current can be induced by oxygen annealing, for example, by rapid thermal annealing (RTA) at about 350° C. to about 550° C. for about ½ to about 5 minutes in oxygen. In one embodiment, the RTA is performed for about 1 minute at about 500° C. in oxygen.

Both conditions can be simultaneously induced in a ferroelectric thin film by annealing at an elevated temperature in oxygen, and by masking portions of the thin film with metal resistant to oxidation and corrosion before the anneal. The metals may comprise, for example, Au, Ag, Ta, Pt, Pd, Rh, Ir, W, Al, Cu, Ti, TiN and combinations thereof. The covered areas will imprint and the open areas will have ideal switching behavior and low leakage current. The patterns can be created using photolithography in which a layer of photoresist is deposited on the ferroelectric film, and selective regions of the photoresist are exposed to light. The photoresist is then developed and in the case of a positive photoresist the exposed regions are chemically removed exposing the bare substrate. A metal layer is then deposited on the photoresist by sputtering, e-beam evaporation or other acceptable physical vapor deposition (PVD) techniques. The photoresist is then lifted off revealing the ferroelectric substrate with a selective surface pattern of metallized regions. The substrate is then given an oxygen anneal to produce imprinted regions under the metallized areas and regions with low leakage current to be used as storage areas under the open areas.

In another embodiment, the metallized patterns can be produced by first coating the entire ferroelectric film with metal and then depositing photoresist on the entire substrate followed by exposing a pattern on the photoresist. By developing the photoresist and removing the exposed regions, certain areas of metal will be exposed which can then be removed by etching to reveal the bare substrate. This structure can then be given an oxygen anneal to create imprinted areas in the covered areas, and areas with low leakage current in the uncovered areas.

Figure 3A:
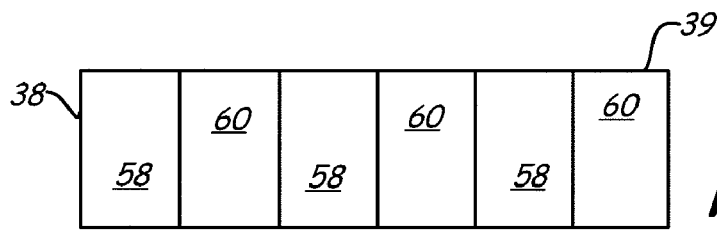
FIG. 3A is a schematic cross-sectional view taken along line 3A-3A of FIG. 2.
Figure 3B:
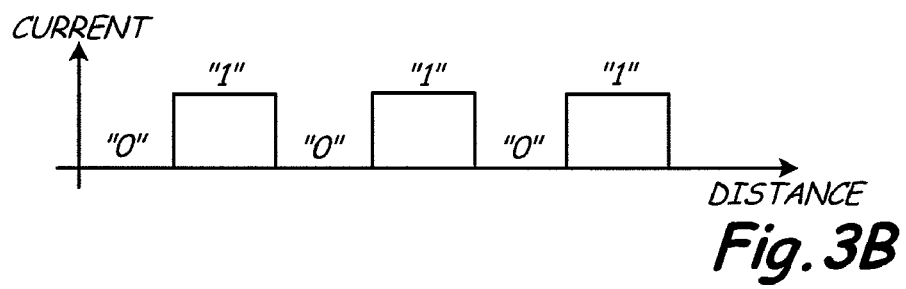
FIG. 3B corresponds to FIG. 3A and graphically illustrates current flow as a result of polarization reversal for an applied voltage signal, according to one aspect of the present invention.

FIG. 3A is a schematic cross-sectional view taken along line 3A-3A of FIG. 2. Specifically, FIG. 3A shows a polarization pattern of unswitchable domains 58 and switchable domains 60 contained in the storage layer 38 of the storage media 37 for providing the described position data in the second media region 56. FIG. 3B corresponds to FIG. 3A and graphically illustrates current flow for polarization reversal when a voltage signal (e.g. a readback voltage signal) is applied to the storage media 37. The unswitchable domains 58 do not switch for the applied signal and, thus, provide either no measurable current flow or a current flow lower than what occurs for the switchable domains 60 at the applied signal. The unswitchable domains 58 are represented by a binary "0". The switchable domains 60 do switch for the applied signal and, thus, provide a measurable current flow. The switchable domains 60 are represented by a binary "1". The resulting position data polarization pattern for this example is, therefore, 0-1-0-1-0-1. The polarization pattern is recognizable by the servo system that positions the transducer 36 relative to the storage media 37 based on the feedback of the position data. It will be appreciated that various polarization patterns may be provided in accordance with the invention by providing various combinations of unswitchable domains 58 and switchable domains 60.

In accordance with the invention, the switchable polarization state domains 55 contained in the first media region 54 and the switchable polarization state domains 60 contained in the second media region 56 are both switchable for an applied voltage signal (e.g. a readback voltage signal). The unswitchable polarization state domains 58 contained in the second media region 56 will not switch for the same applied voltage signal that is used to switch the domains 55 and 60. Thus, read/write operations performed by the transducer 36 will not affect the unswitchable domains 58 that make up a part of the position data. Therefore, it will be appreciated that when aspects of the invention are used to form a storage media 37, the read/write electronic circuit used in the storage device only needs to have the ability to apply a voltage signal to switch the domains 55 and 60 in order to provide for both readback operations and identifying read position data or servo information that is contained in the second media region 56.

After the position data has been read and processed, a voltage signal with the opposite polarity as to the signal used to read the position data will be applied to the second media region 56 to reset the switchable domains 60 to their original polarization state; the polarization state in the unswitchable domains 58 will not be affected. Advantageously, this provides for the position data polarization pattern to be reset.

In order to establish the second media region 56 having the described unswitchable domains 58 and switchable domains 60 to represent position data, the selected domains that need to be unswitchable domains 58 must be made unswitchable. This is done at the time of manufacture of the storage media 37 by, for example, ferroelectric imprint which will be described in more detail below.

Figure 4:
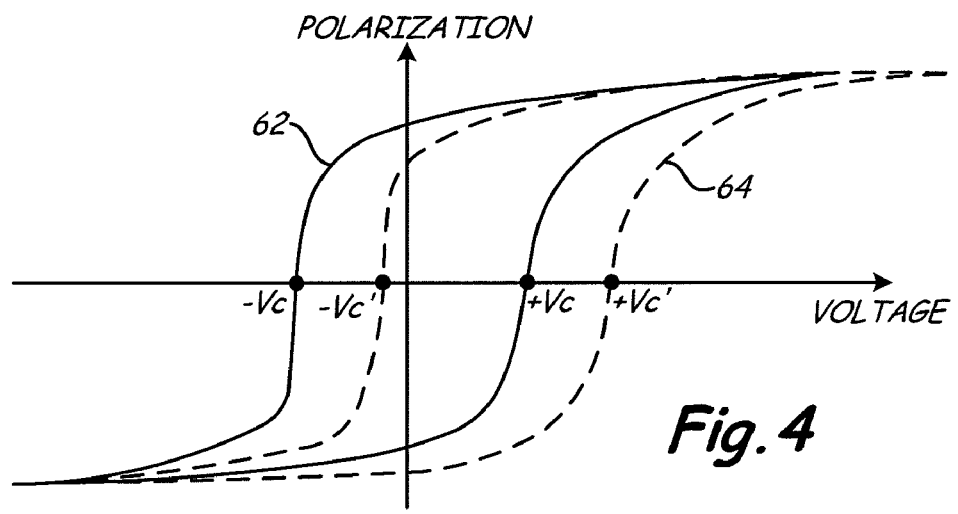
FIG. 4 illustrates a hysteresis loop of polarization of a ferroelectric material that is not imprinted (solid line) and of a ferroelectric material that is imprinted (dashed line), according to one aspect of the present invention.

Referring to FIG. 4, the use of ferroelectric imprint to establish unswitchable domains 58 will be described. Imprinting generally refers to the ability to produce a voltage shift in the hysteresis polarization-voltage loops of ferroelectric materials such as, for example, lead zirconate titanate (PZT) or strontium bismuth tantalate (SBT). Imprinting is accomplished by the application of energy to a selected area, such as the area that makes up domains 58. The energy can be, for example, in the form of applying heat to the ferroelectric material.

FIG. 4 shows a typical hysteresis loop 62 (shown in solid line) for a ferroelectric material that is not imprinted. A horizontal axis represents voltage and a vertical axis represents polarization. The hysteresis loop 62 illustrates that for the chosen ferroelectric material a symmetric coercive voltage, Vc, must be applied on the positive voltage side (+Vc) or negative voltage side (−Vc) to switch the polarization.

FIG. 4 also illustrates a typical hysteresis loop 64, shown in dashed line, for a ferroelectric material that has been imprinted. Imprinting results in the coercive voltage, Vc, of the ferroelectric material being increased either at the positive voltage side (+Vc') or at the negative voltage side (−Vc'). The polarization of the imprinted material becomes unswitchable for an applied voltage that is less than the increased coercive voltage, wherein the increased coercive voltage value is the larger of |+Vc'| and |−Vc'| (i.e. the absolute value of +Vc' and −Vc'). For the example shown in FIG. 4, the loop 64 is shifted to the right or positive voltage side and, therefore, the coercive voltage is increased on the positive voltage side (+Vc') and the increased coercive voltage is |+Vc'|. The imprinting in this example results in an increased coercive voltage at the positive voltage side and a decreased coercive voltage at the negative voltage side, i.e. |+Vc'|>|Vc|, and |−Vc'|<|Vc|. Thus, if such an imprint is applied to the domains 58 they would have a corresponding coercive voltage of |+Vc'|. The domains 60 would maintain the coercive voltage, Vc. Then, for an applied voltage signal, V, such that |Vc|<|V|<|+Vc'|, the polarization of the domains 58 would not switch but the polarization of the domains 60 would switch. In addition, hysteresis loop shifting to the positive voltage side in the domains 58 also means the polarization is stabilized in the negative direction by the imprinting. Therefore, a negative voltage, V, will not cause the polarization of the domains 58 to switch because the polarization is already in the negative direction; a positive voltage, V, is not able to switch the polarization of the domains 58 from negative to positive because the positive voltage, V, is smaller than +Vc'.

It will be appreciated that in accordance with the invention, the loop 64 may be shifted to the negative voltage side rather than shifting to the positive voltage side as described hereinabove. When the loop 64 is shifted to the negative voltage side, an increased coercive voltage is expected at the negative voltage side while a reduced coercive voltage is expected at the positive voltage side, i.e. |−Vc'|>|+Vc'|. In such a case, for an applied voltage signal, V, such that |Vc|<|V|<|−Vc'|, the polarization of the domains 58 would not switch but the polarization of the domains 60 would switch.

Figure 5:
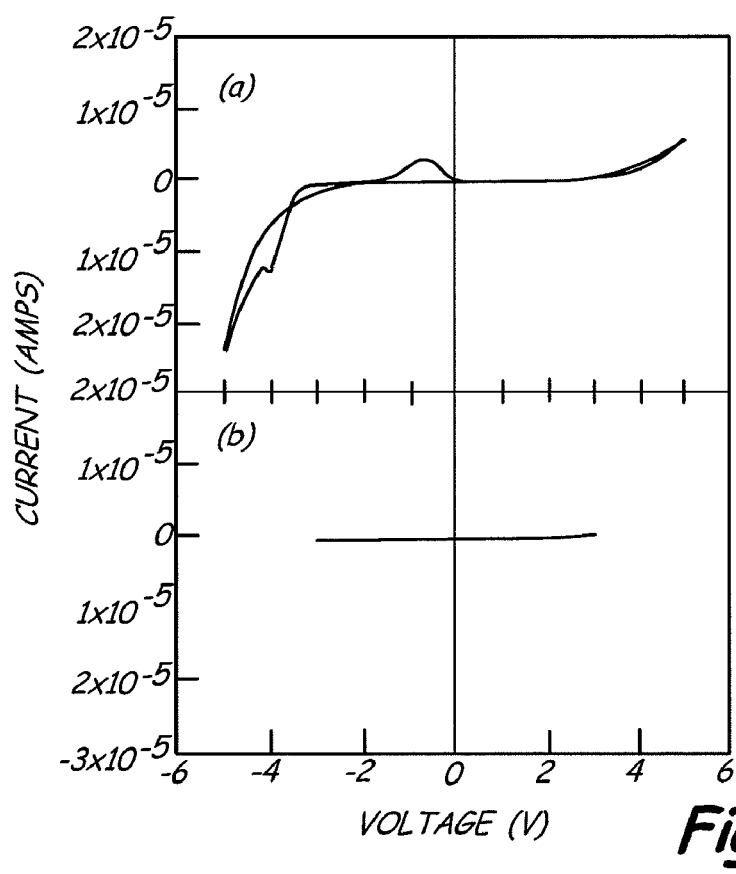
FIG. 5 graphically illustrates current response versus voltage applied for a ferroelectric imprinted ferroelectric material, according to one aspect of the present invention.

It was discovered that annealing a ferroelectric material such as PZT in a reducing environment resulted in strong ferroelectric imprint. FIG. 5 illustrates the current versus voltage behavior of a 30 nm thick PZT film that has been given a rapid thermo anneal (RTA) at 500° C. in a reducing (Argon) environment. The top portion (a) of FIG. 5 shows that because the ferroelectric hysteresis is shifted to the negative voltage part due to the imprint, a negative voltage larger than about −4V would be needed to switch the polarization to the negative direction. The bottom portion (b) of FIG. 5 shows the current response of an imprinted area for an applied voltage between −3V and +3V. As shown, the current is zero (0) meaning that there was no switching, i.e. no polarization reversal, for the range of voltages applied between −3V and +3V.

Figure 6A:
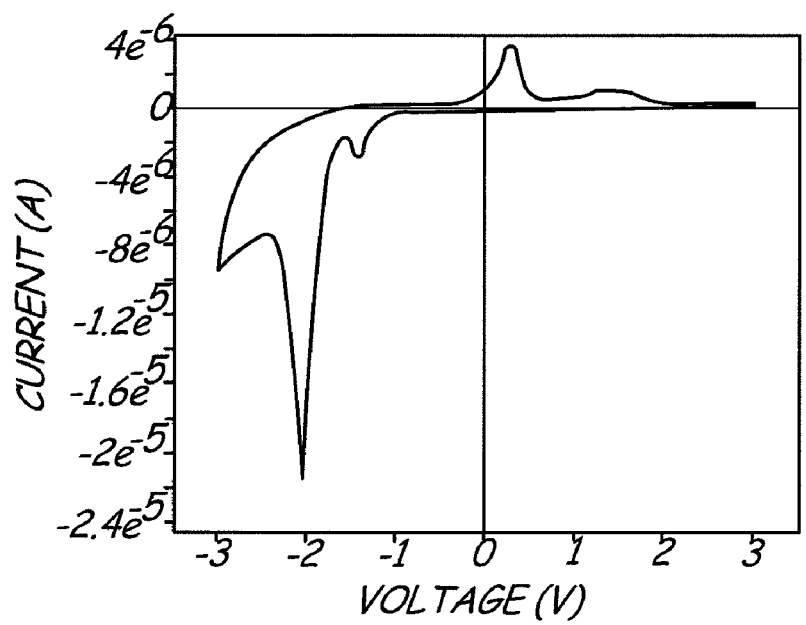
FIGS. 6A and 6B illustrate current versus voltage hysteresis curves of a PZT film with and without Pt coverage during oxygen anneal measured after the anneal.
Figure 6B:
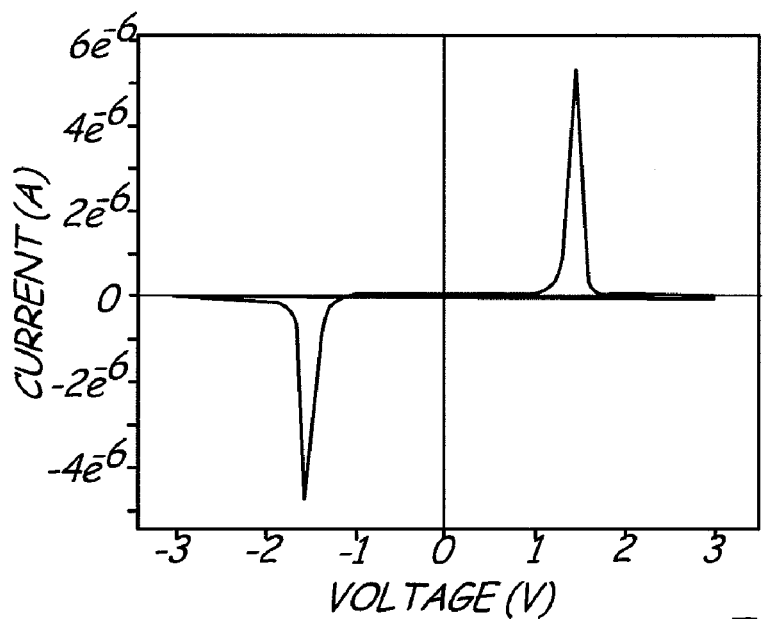
Figure 7A:
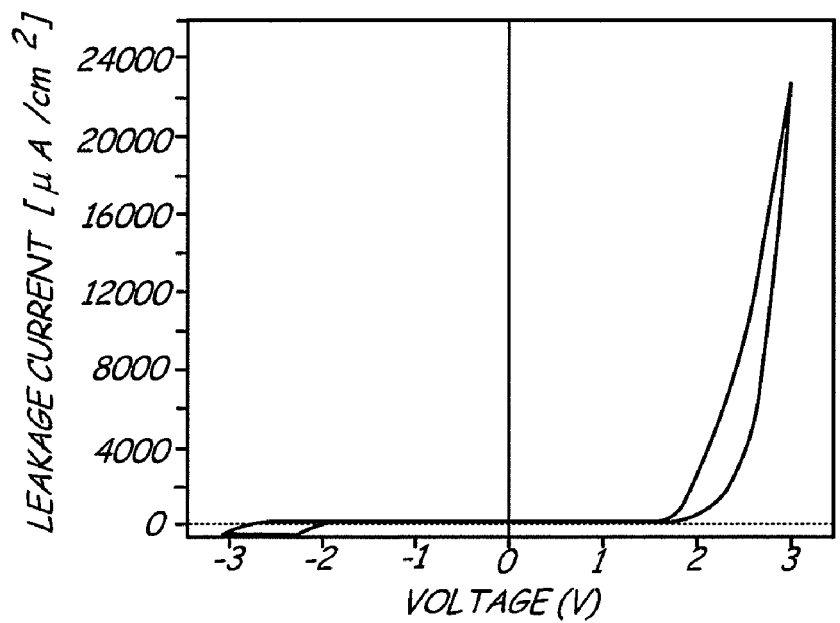
FIGS. 7A and 7B illustrate electrical leakage measurements on the film shown in FIG. 6B before and after oxygen anneal.
Figure 7B:
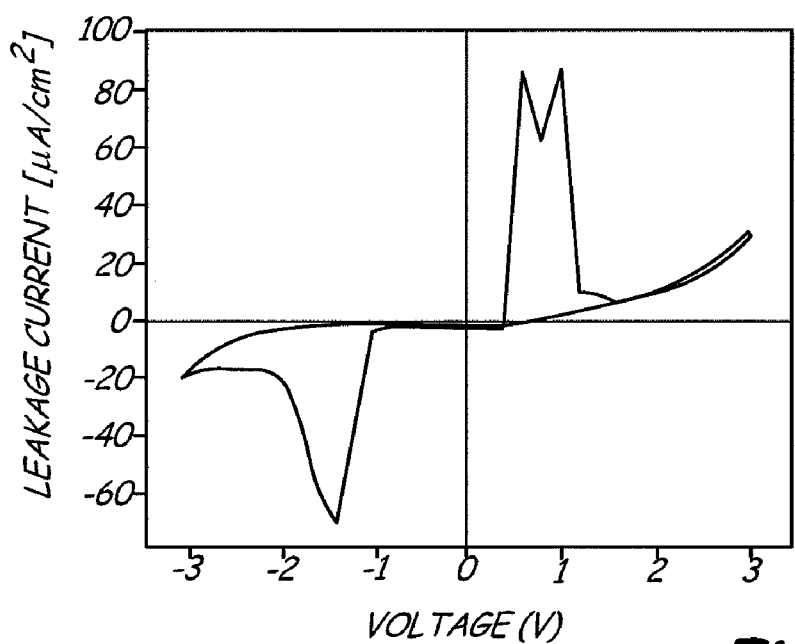

Another way to create a reducing environment is by covering the film with a metal mask during an oxygen anneal. Thus, one embodiment of the invention is to mask selected areas of the ferroelectric film with metal to define non-switchable regions and to anneal the film in an oxidizing environment. Following the anneal and removal of the metal mask, the masked areas will be imprinted and will not switch, and the unmasked areas will exhibit classic ferroelectric switching. In this embodiment, non-switchable areas and switchable areas can be created simultaneously. This behavior is illustrated in FIGS. 6A and 6B, which show the hysteresis curves for a 30 nm thick layer of PZT that was partially covered with a Pt mask and given a rapid thermo anneal (RTA) in oxygen at 500° C. for one minute. FIG. 6A shows the hysteresis behavior of an area of the film that was covered with the metal mask. The area shows strong imprint. A negative voltage of about −3V would be needed to switch the imprinted area. FIG. 6B shows the hysteresis behavior of an area of the film that was not masked during the RTA. The area shows classic symmetric ferroelectric switching behavior. In another embodiment of the invention, the uncovered area shows exceptionally low leakage current. FIG. 7A shows leakage current measurements made on the uncovered area shown in FIG. 6B before the rapid thermal anneal (RTA) for one minute in oxygen at 500° C. FIG. 7B shows leakage current measurements made on the uncovered area after the RTA. The leakage current after the anneal has decreased by over two orders of magnitude.

Figure 8:
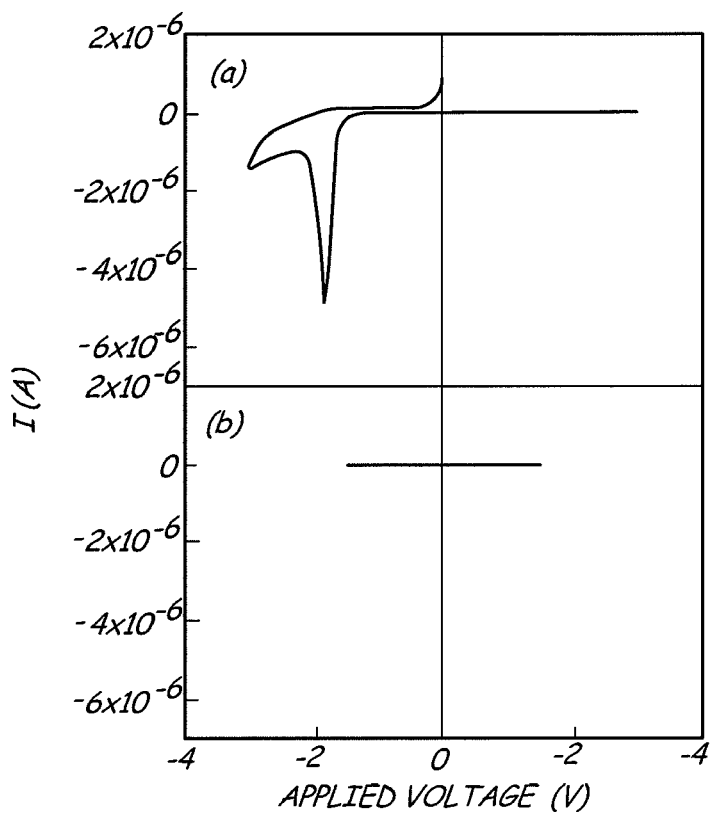
FIG. 8 illustrates current versus voltage hysteresis curves for PZT film with Ir coverage during oxygen anneal, measured after the anneal.
Figure 9:
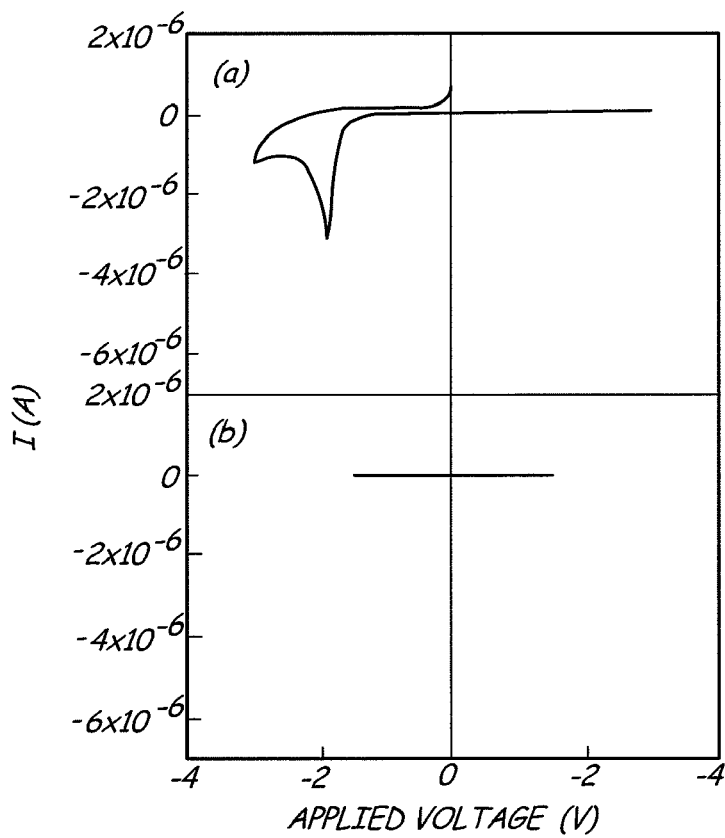
FIG. 9 illustrates the same measurements on the film in FIG. 8 after $10^8$ cycles at ±1.5V.

Another aspect of the invention is that the imprinting is stable. FIG. 8 shows current versus voltage hysteresis measurements of PZT film with Ir electrodes after RTA for 1 minute in oxygen at 500° C. The top portion (a) of FIG. 8 shows the loop to be shifted such that over −3V would be needed to switch the film. The bottom portion (b) of FIG. 8 shows that no switching current is detected under ±1.5V. Top and bottom portions (a) and (b) of FIG. 9 show the identical behavior after $10^8$ voltage cycling at the non-switching condition, ±1.5V.

Figure 10A:
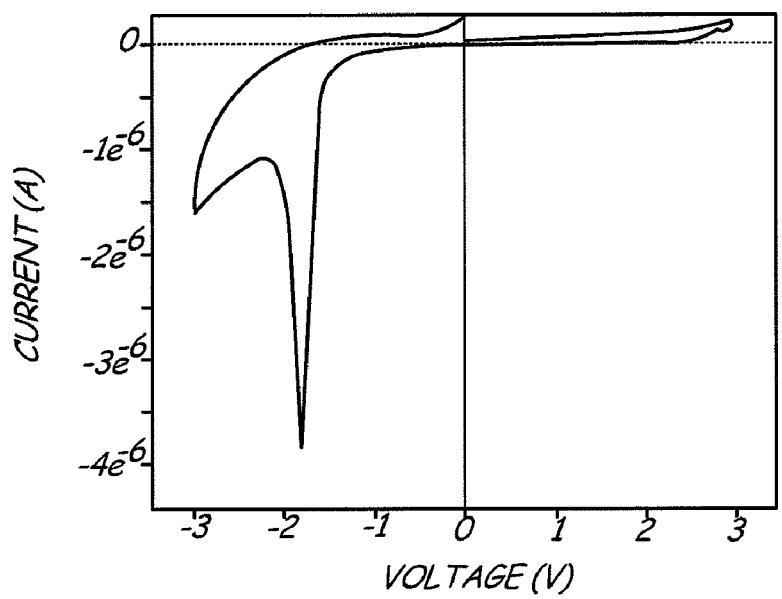
FIGS. 10A and 10B illustrate current versus voltage for PZT film with Ir coverage during oxygen anneal measured after the anneal during ±3V cycling.
Figure 10B:
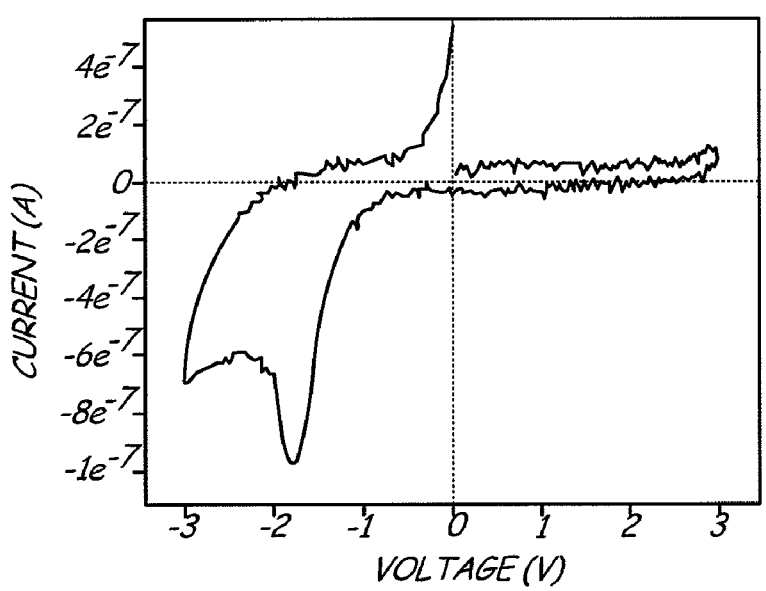

Furthermore, the imprinted polarization is stable even after cycling at ±3V. FIG. 10A shows ferroelectric hysteresis measurements cycled at ±3V on a PZT film with Ir electrodes immediately after RTA oxygen anneal for 1 minute at 500° C. FIG. 10B shows the imprinted polarization still exists after $10^8$±3V cycles. This indicates a long term imprinted state since 3V is high enough to switch the polarization.

Although the present invention has been described with reference to preferred embodiments, workers skilled in the art will recognize that changes may be made in form and detail without departing from the spirit and scope of the invention.

What is claimed is:

1. A method to simultaneously create patterns on a ferroelectric thin film substrate containing switchable regions that exhibit stable switching behavior and non-switchable regions that do not switch, the method comprising:
providing a ferroelectric thin film substrate characterized by an initial leakage current;
masking selected areas of the ferroelectric thin film substrate with metal to define the non-switchable regions;
exposing the masked substrate to a short term, elevated temperature, oxidizing anneal resulting in areas that are not masked to remain switchable, wherein the switchable areas are characterized by a final leakage current and wherein the final leakage current is less than the initial leakage current; and
removing the metal mask to expose the non-switchable regions.

2. The method of claim 1, wherein the non-switchable regions exhibit ferroelectric imprint and the switchable regions exhibit stable switching behavior and low leakage current.

3. The method of claim 1, wherein the non-switchable regions define reference locations.

4. The method of claim 1, wherein the metal is Au, Ag, Ta, Pt, Pd, Rh, Ir, W, Al, Cu, Ti, TiN or combinations thereof.

5. The method of claim 1, wherein the oxidizing atmosphere is oxygen.

6. The method of claim 1, wherein the ferroelectric is selected from the group consisting of lead zirconate titanate (PZT), barium titanate, (BTO) strontium bismuth tantalate (SBT), bismuth ferrite (BFO) and combinations thereof.

7. The method of claim 1, wherein the elevated temperature is about 350° C. to about 550° C.

8. The method of claim 7, wherein the elevated temperature is about 500° C.

9. The method of claim 1, wherein a duration of the elevated temperature oxidizing anneal is about one half to about 5 minutes.

10. The method of claim 9, wherein the duration is about one minute.

11. A method to produce a ferroelectric thin film storage medium containing switchable regions that exhibit stable switching behavior and non-switchable regions that do not switch, the method comprising:
providing a ferroelectric thin film substrate characterized by an initial leakage current;
masking selected areas on the thin film substrate with metal to define the non-switchable regions; and
exposing the masked substrate to a short term, elevated temperature, oxidizing anneal resulting in areas that are not masked to remain switchable, wherein the switchable areas are characterized by a final leakage current and wherein the final leakage current is less than the initial leakage current; and
removing the metal mask to expose the non-switchable regions.

12. The method of claim 11, wherein the non-switchable regions exhibit ferroelectric imprint and are not switchable, and the switchable regions exhibit stable switching behavior and low leakage current and act as data storage regions.

13. The method of claim 11, wherein the non-switchable regions define reference locations.

14. The method of claim 11, wherein the metal is Au, Ag, Ta, Pt, Pd, Rh, Ir, W, Al, Cu, Ti, TiN or combinations thereof.

15. The method of claim 11, wherein the oxidizing atmosphere is oxygen.

16. The method of claim 11, wherein the ferroelectric is selected from the group consisting of lead zirconate titanate (PZT), barium titanate (BTO), strontium bismuth tantalate (SBT), bismuth ferrite (BFO), and combinations thereof.

17. The method of claim 11, wherein the elevated temperature is about 350° C. to about 550° C.

18. The method of claim 17, wherein the elevated temperature is about 500° C.

19. The method of claim 11, wherein a duration of the elevated temperature oxidizing anneal is about one half to about 5 minutes.

* * * * *